United States Patent
Tsai et al.

(10) Patent No.: US 11,498,830 B2
(45) Date of Patent: Nov. 15, 2022

(54) STRUCTURE OF MICRO-ELECTRO-MECHANICAL-SYSTEM MICROPHONE AND METHOD FOR FABRICATING THE SAME

(71) Applicant: Solid State System Co., Ltd., Hsinchu (TW)

(72) Inventors: Cheng-Wei Tsai, Taichung (TW); Tsung-Min Hsieh, New Taipei (TW); Chien-Hsing Lee, Hsinchu County (TW)

(73) Assignee: Solid State System Co., Ltd., Hsinchu (TW)

( * ) Notice: Subject to any disclaimer, the term of this patent is extended or adjusted under 35 U.S.C. 154(b) by 439 days.

(21) Appl. No.: 16/812,395

(22) Filed: Mar. 9, 2020

(65) Prior Publication Data

US 2021/0276857 A1     Sep. 9, 2021

(51) Int. Cl.
*H04R 31/00*     (2006.01)
*H04R 7/18*     (2006.01)
(Continued)

(52) U.S. Cl.
CPC ........ *B81B 3/0021* (2013.01); *B81C 1/00158* (2013.01); *B81C 1/00166* (2013.01);
(Continued)

(58) Field of Classification Search
CPC ...... B81B 3/0021; H04R 7/18; H04R 31/003; H04R 2201/003; H04R 7/04; H04R 19/04; H04R 19/005; H04R 9/08; H04R 31/00
See application file for complete search history.

(56) References Cited

U.S. PATENT DOCUMENTS

| | | | |
|---|---|---|---|
| 8,542,851 B2 * | 9/2013 | Kasai | H04R 19/005 381/175 |
| 9,681,234 B2 * | 6/2017 | Yuan | H04R 19/04 |

(Continued)

FOREIGN PATENT DOCUMENTS

| | | |
|---|---|---|
| CN | 102244827 | 8/2014 |
| CN | 105282678 | 6/2019 |

(Continued)

OTHER PUBLICATIONS

"Office Action of Taiwan Counterpart Application", dated Jul. 12, 2021, p. 1-p. 8.

*Primary Examiner* — Brian Ensey
(74) *Attorney, Agent, or Firm* — JCIPRNET

(57) ABSTRACT

The invention provides a MEMS microphone. The MEMS microphone includes a substrate, having a first opening. A dielectric layer is disposed on the substrate, wherein the dielectric layer has a second opening aligned to the first opening. A diaphragm is disposed within the second opening of the dielectric layer, wherein a peripheral region of the diaphragm is embedded into the dielectric layer at sidewall of the second opening. A backplate layer is disposed on the dielectric layer and covering over the second opening. The backplate layer includes a plurality of acoustic holes arranged into a regular array pattern. The regular array pattern comprises a pattern unit, the pattern unit comprises one of the acoustic holes as a center hole, and peripheral holes of the acoustic holes surrounding the center hole with a same pitch to the center hole.

19 Claims, 9 Drawing Sheets

(51) Int. Cl.
*B81B 3/00* (2006.01)
*B81C 1/00* (2006.01)
(52) U.S. Cl.
CPC ............ *H04R 7/18* (2013.01); *H04R 31/003* (2013.01); *B81B 2201/0257* (2013.01); *B81B 2203/0127* (2013.01); *B81B 2203/0353* (2013.01); *B81B 2203/04* (2013.01); *B81C 2201/013* (2013.01); *H04R 2201/003* (2013.01)

(56) References Cited

U.S. PATENT DOCUMENTS

| | | | |
|---|---|---|---|
| 9,994,440 B2* | 6/2018 | Jenkins | B81B 3/0072 |
| 10,506,345 B2* | 12/2019 | Klein | H04R 7/02 |
| 2019/0116427 A1* | 4/2019 | Inoue | B81B 3/0072 |

FOREIGN PATENT DOCUMENTS

| | | |
|---|---|---|
| CN | 110753293 | 2/2020 |
| TW | 200711510 | 3/2007 |
| TW | 200740687 | 11/2007 |

* cited by examiner

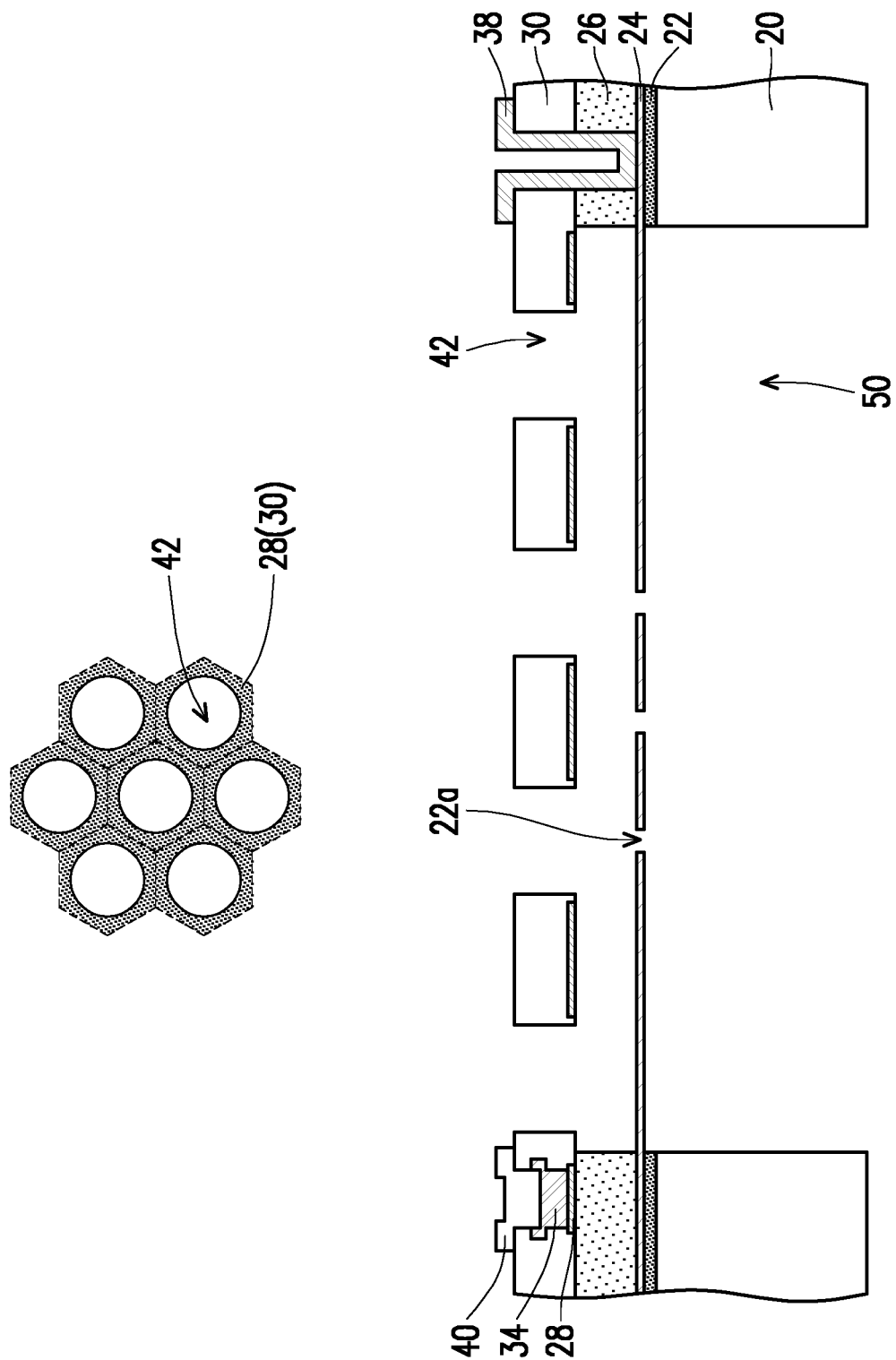

STRUCTURE OF MICRO-ELECTRO-MECHANICAL-SYSTEM MICROPHONE AND METHOD FOR FABRICATING THE SAME

BACKGROUND

1. Field of the Invention

The invention is related to semiconductor fabrication, and particularly related to the structure of micro-electro-mechanical-system (MEMS) microphone and the method for fabricating the MEMS microphone.

2. Description of Related Art

Microphone has been designed based on semiconductor fabrication technology, so as to greatly reduce the size. The MEMS microphone is a popular device used in electronic apparatus to sense acoustic signals, such as the communication voice.

The function of the MEMS microphone to sense the acoustic signal is based on a diaphragm, which is responding to the air pressure from the acoustic signal with a frequency, so to vibrate corresponding to the frequency and amplitude of the acoustic signal. The acoustic signal is then converted into electric signal for subsequent application in peripheral electronic apparatus.

During fabrication, the diaphragm of the MEMS microphone before being released is embedded in the dielectric layer, and the backplate layer with acoustic holes are formed on the dielectric layer. The dielectric material covering on both sides of the diaphragm would be subsequently removed so to release the diaphragm. The removing the dielectric material, the etching process would etch the dielectric material through the acoustic holes in the backplate layer. Since a relatively large amount of dielectric material between the diaphragm and the backplate layer should be removed, it usually takes a long time for etching. The mechanical intensity of dielectric material during the etching process may be not uniform, which may cause instability of the etching process.

How to design the MEMS microphone in accordance with the condition of fabrication process to complete the MEMS microphone is still under developing in the art.

SUMMARY OF THE INVENTION

The invention provides a structure of MEMS microphone and a method for fabricating the MEMS microphone, in which the acoustic holes in the backplate layer is uniform. The etching process to release the diaphragm may be easily performed with improved etching condition.

The invention provides a MEMS microphone. The MEMS microphone includes a substrate, having a first opening. A dielectric layer is disposed on the substrate, wherein the dielectric layer has a second opening aligned to the first opening. A diaphragm is disposed within the second opening of the dielectric layer, wherein a peripheral region of the diaphragm is embedded into the dielectric layer at sidewall of the second opening. A backplate layer is disposed on the dielectric layer and covering over the second opening. The backplate layer includes a plurality of acoustic holes arranged into a regular array pattern. The regular array pattern comprises a pattern unit, the pattern unit comprises one of the acoustic holes as a center hole, and peripheral holes of the acoustic holes surrounding the center hole with a same pitch to the center hole.

The invention also provides a MEMS microphone. A structure of the MEMS microphone includes a substrate, having a first opening. A dielectric layer is disposed on the substrate, wherein the dielectric layer has a second opening aligned to the first opening. A diaphragm is disposed within the second opening of the dielectric layer, wherein a peripheral region of the diaphragm is embedded into the dielectric layer at sidewall of the second opening. A backplate layer is disposed on the dielectric layer and covering over the second opening. The backplate layer includes a plurality of acoustic holes arranged into a regular array pattern. The regular array pattern includes a hexagon unit, each hexagon unit has six of the acoustic holes at corners and one of the acoustic holes at a center.

The invention also provides a method for fabricating MEMS microphone. The method includes providing a substrate; forming a dielectric layer on the substrate, wherein the dielectric layer is embedded with a diaphragm; forming a backplate layer on the dielectric layer, wherein the backplate layer includes a plurality of acoustic holes arranged into a regular array pattern. The regular array pattern includes a hexagon unit. Each hexagon unit has six of the acoustic holes at corners and one of the acoustic holes at a center. The substrate is patterned to have a first opening. An etching process is performed to etch a portion of the dielectric layer to form a second opening for releasing a sensing region of the diaphragm, wherein the etching process includes etching the dielectric layer through the acoustic holes at one side of the diaphragm.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3 is a drawing, schematically illustrating a cross-sectional view of a MEMS microphone, according to an embodiment of the invention.

DESCRIPTION OF THE EMBODIMENTS

The invention is directed to a structure of MEMS microphone and the method for fabricating the MEMS microphone. The MEMS microphone has the backplate layer with uniform acoustic holes. The acoustic holes with uniformity allow the dielectric layer under backplate layer to be etched in better condition of uniformity. The mechanical intensity of dielectric layer may have better condition of uniformity during releasing the diaphragm.

Multiple embodiments are provided for description but the invention is not just limited to the multiple embodiments. In addition, a combination between the embodiments may be made.

For the MEMS microphone, the diaphragm is thin and flexible to sense the acoustic signal. As to fabrication, the diaphragm is embedded in a dielectric layer. The dielectric material at one side under the backplate layer is relatively thick. The path to etch the dielectric material under the backplate layer is basically going through the acoustic holes in the backplate layer. The distribution of the acoustic holes may affect the etching process being performed, in which the dielectric layer may be not evenly etched, causing non-uniform intensity from the dielectric layer. The diaphragm may be damaged during the etching process for releasing the diaphragm.

The invention provides a structure of the backplate layer with uniform distribution for the acoustic holes. The etching process may uniformly etch the dielectric layer through the acoustic holes.

Figure 1:
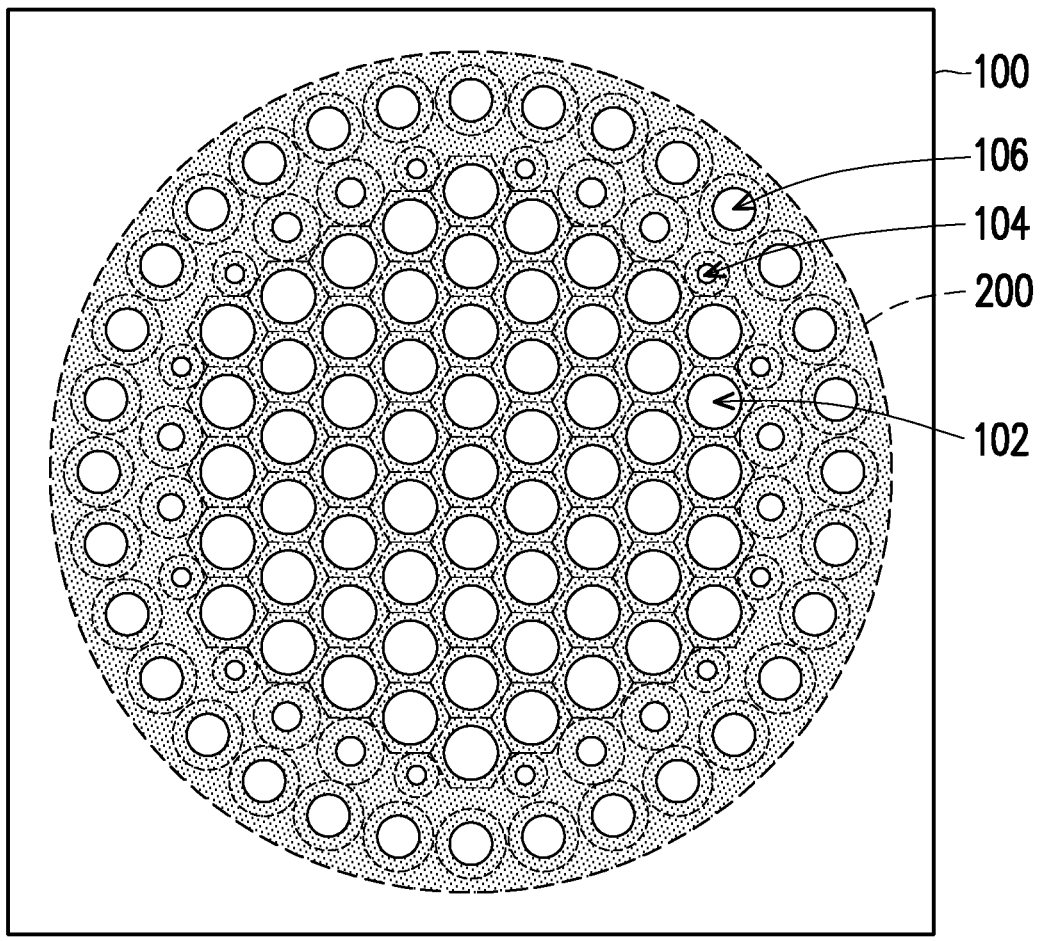
FIG. 1 is a drawing, schematically illustrating a plane view over the backplate layer of a structure of MEMS microphone, according to an embodiment of the invention.

FIG. 1 is a drawing, schematically illustrating a plane view over the backplate layer of a structure of MEMS microphone, according to an embodiment of the invention. Referring to FIG. 1, the backplate layer 100 of the MEMS microphone has a plurality of acoustic holes 102 within the diaphragm region 200. The diaphragm would be implemented under the backplate layer 100 at the diaphragm region 200 preserved in the backplate layer 100. The acoustic holes 102 allowing the etching process to etch the dielectric material between the backplate layer 100 and the diaphragm, corresponding to the diaphragm region 200.

In an embodiment, the backplate layer 100 may be configured to have a central region and a peripheral region. The acoustic holes 102 are distributed within the central region. The backplate layer 100 within the peripheral region further includes outer-ring acoustic holes 106 and interfacing acoustic holes 104, wherein the outer-ring acoustic holes 106 with a first size are distributed as a ring at a periphery of the backplate layer 100. The first size is uniform, in an embodiment. The interfacing acoustic holes 104 with a second size are distributed between the ring from the outer-ring acoustic holes 106 and the central region from the acoustic holes 102. The second size in an embodiment is non-uniform and the second size is less than the first size, based on the distance within central region and outer-ring space for uniform etching process. The first size in an embodiment is also less than the size of the acoustic holes 102 within the central region.

The circle distribution of the outer-ring acoustic holes 106 may make dielectric layer of MEMS at the boundary be more uniform and enhance diaphragm pressure resistance when suddenly suffering external pressure impact. The interfacing acoustic holes 104 compensates the distribution between acoustic holes 102 within the central region and the outer-ring acoustic holes 106 at the peripheral ring. As a result, the dielectric layer under the interfacing acoustic holes 104 may also be efficiently removed during the etching process.

To uniformly etch the dielectric layer, as to be described later, the arrangement of the acoustic holes 102 may be the factor to improve the etching quality for the dielectric layer, and then smoothly release the diaphragm.

In an embodiment, the acoustic holes 102 are arranged into a regular array pattern. The regular array pattern in an embodiment includes a pattern unit, such as a hexagon unit. The pattern unit includes one acoustic hole 102 as a center acoustic hole and peripheral acoustic holes 102 surrounding the center acoustic hole 102 with a same pitch to the center acoustic hole.

In an embodiment, the acoustic holes 102 are arranged into a hexagon array pattern. The pattern unit is a hexagon as an example. In the hexagon unit, one acoustic hole 102 is treated as a center hole, then six peripheral acoustic holes 102 at the six corners of the hexagon unit. In this structure, the peripheral acoustic holes 102 to the center acoustic hole 102 are same distance or same pitch to the central acoustic holes 102.

In an embodiment, the acoustic hole 102 is round but the invention is not limited to the round holes. The hexagon holes may also be set. To have the uniform distribution of the acoustic holes, the pattern unit is also not just limited to the hexagon unit. A square unit may also be made in an embodiment. In the square unit, the acoustic hole may also be a square hole, as well. The invention arranges one acoustic hole 102, except those in the peripheral region, to suffer about the same intensity from the adjacent acoustic holes, in which the pattern unit of the acoustic holes 102 may be properly arranged in various manners, not limited to the embodiments as provided.

The method for fabricating the MEMS microphone is described, in which the acoustic holes in the backplate layer may be arranged according to FIG. 1 as described.

FIG. 2A to FIG. 2G are drawings, schematically illustrating a cross-sectional view of processing flow of a method to fabricating a MEMS microphone, according to an embodiment of the invention.

Figure 2A:
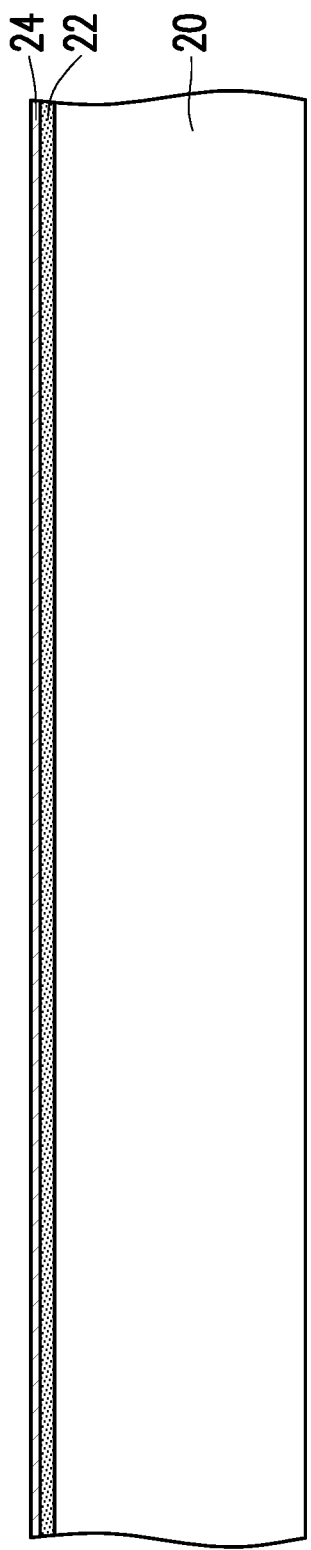
FIG. 2A to FIG. 2G are drawings, schematically illustrating a cross-sectional view of processing flow of a method to fabricating a MEMS microphone, according to an embodiment of the invention.

Referring to FIG. 2A, a substrate 20, such as semiconductor substrate or silicon substrate, is provided as a base. A dielectric layer 22 is disposed on the substrate 20. A conductive layer 24 is formed on the dielectric layer 22. The conductive layer 24 in an embodiment here is just generally shown. The conductive layer 24 may have sub structure to form the diaphragm. The structure of the diaphragm is not limited to the embodiments.

Figure 2B:
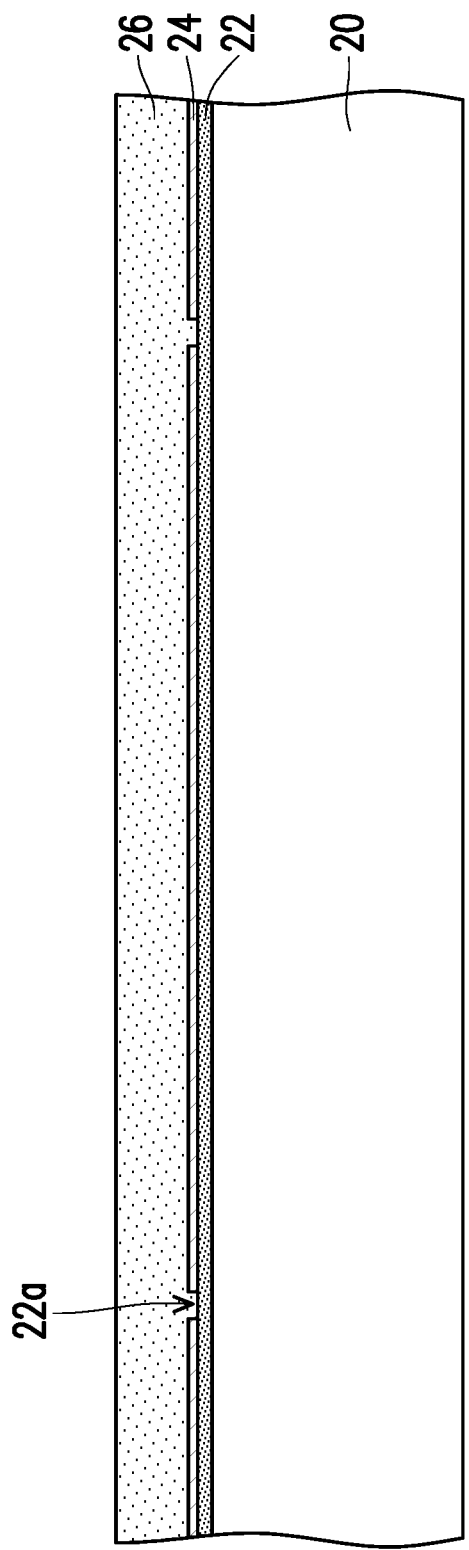

Referring to FIG. 2B, the conductive layer 24 is further patterned to have pressure balance holes 22a. The pressure balance holes 22a allows the air pressure at both sides of the diaphragm, which is formed from the conductive layer 24 when the conductive layer 24 is released later, to be balance. The effect of the pressure balance holes 22a would be described later. Another dielectric layer 26 is also formed over the conductive layer 24. The dielectric layer 26 and the dielectric layer 22 are formed together and may be generally treated as a dielectric layer.

Figure 2C:
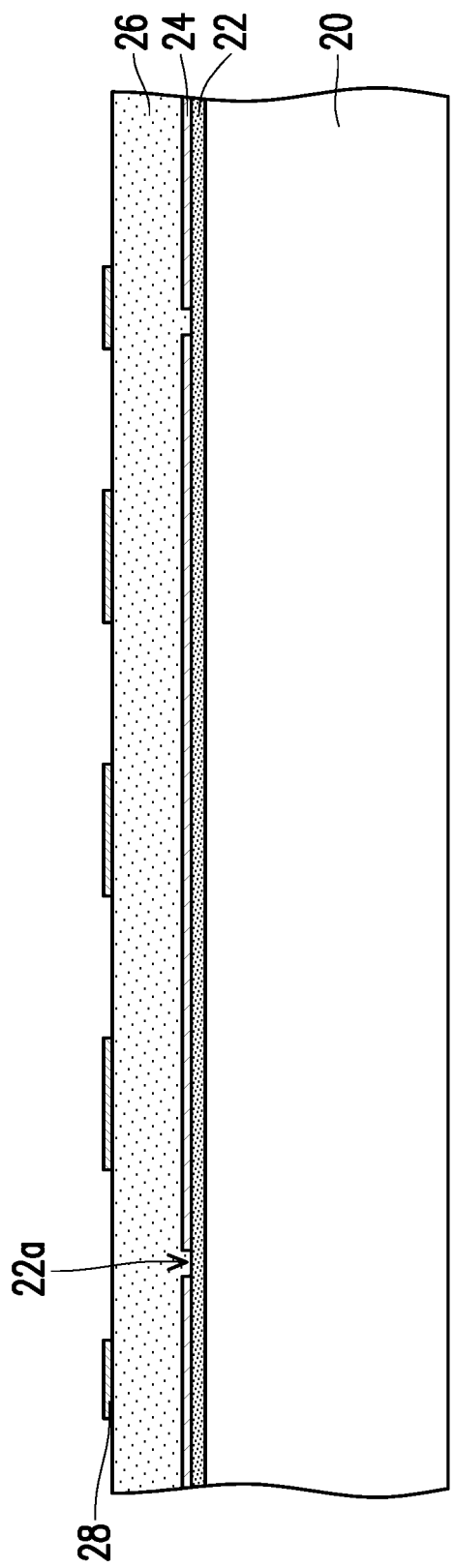

Referring to FIG. 2C, an electrode layer 28 is formed on the dielectric layer 26. The electrode layer 28 at the end is a part of the backplate layer. In an embodiment, the electrode layer 28 is pattered to have the openings, which is corresponding to the locations of the acoustic holes, as previously described in FIG. 1. The electrode layer 28 in actual operation is serving as an anode while the conductive layer 24 is serving as a cathode, so as to form a sensing capacitor.

Figure 2D:
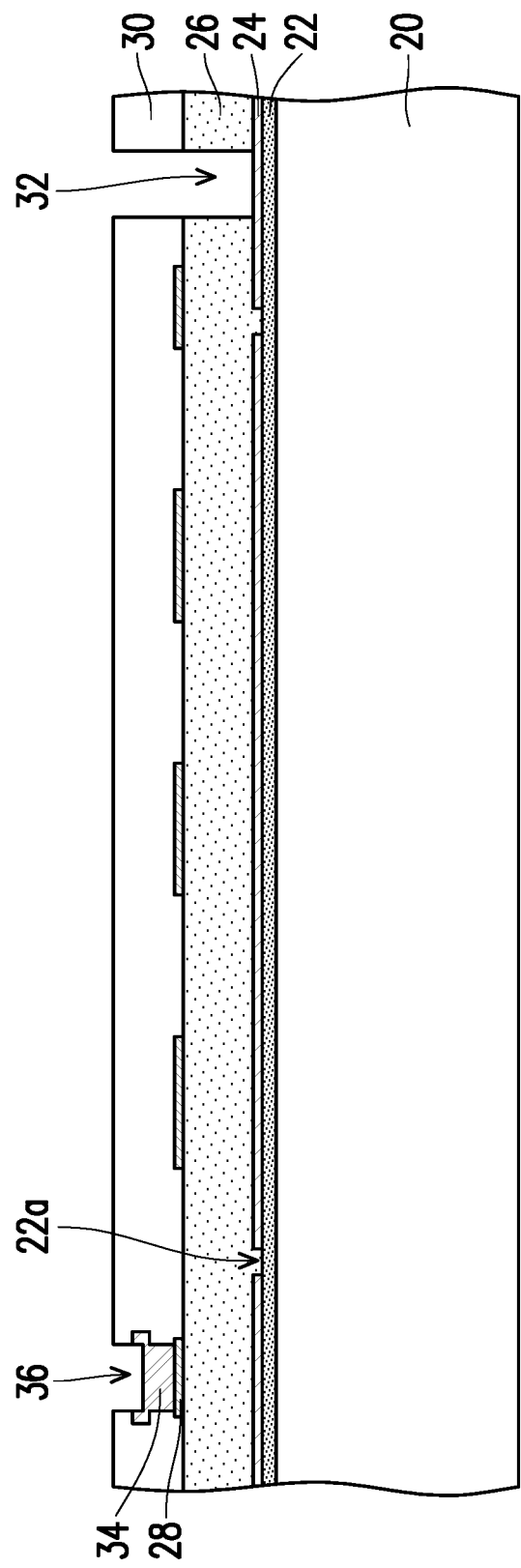

Referring to, FIG. 2D, a backplate layer 30 in a preliminary layer without acoustic holes is formed over the dielectric layer 26 and the electrode layer 28. The material may be nitride or other dielectric material but different from the dielectric layer 26, which usually is oxide in an example. The backplate layer 30 would be integrated with the electrode layer 28 as to be seen later. The backplate layer 30 is then generally including the electrode layer 28 after the acoustic holes are formed later.

However, the conductive layer 24 is actually serving as the cathode and the electrode layer 28 is actually serving as the anode. To have the interconnection to the conductive layer 24 and the electrode layer 28, the backplate layer 30 and the dielectric layer 26 are patterned to have the opening 32 and the opening 36. The opening 32 exposes the conductive layer 24. The opening 36 exposes the electrode layer 28. In an embodiment, a first-stage plug 34 may be formed in the backplate layer 30 beforehand but the invention is not limited to the manner to form the plug 34.

Figure 2E:
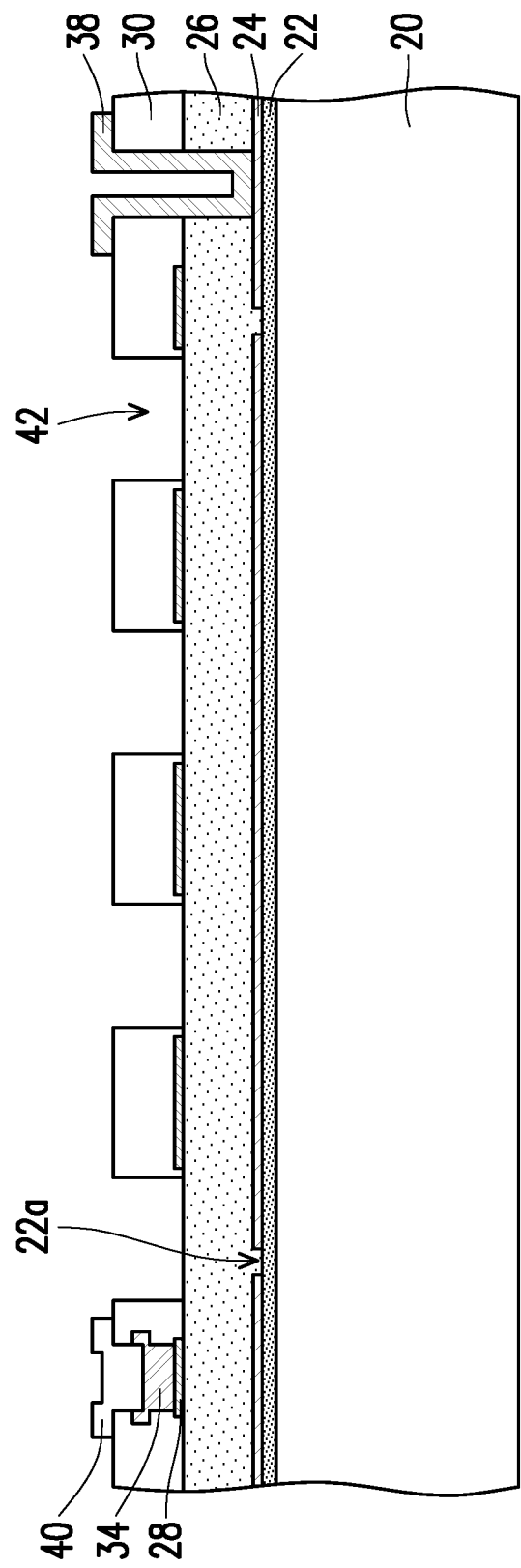

Referring to FIG. 2E, another plug 38 is formed in the opening 32 to contact the conductive layer 24. In addition, the second-stage plug 40 is also formed in the opening 36 and contact with the first-stage plug 34. The first-stage plug 34 and the second-stage plug 40 together form a contact plug, which is connected to the electrode layer 28. The structure and the method to form the contact plug are not just limited to the embodiments. In other words, the first-stage plug 34 with the second-stage plug 40 may be replaced by other type of plug, similar to the plug 38 in an example.

Further, the backplate layer 30 is patterned to have the acoustic holes 42. The arrangement of the acoustic holes 42 is similar to the acoustic holes 102, the interfacing acoustic holes 104 and the outer-ring acoustic holes 106 as described in the FIG. 1. The electrode layer 28 is disposed on the inner side of the backplate layer 30, as a part of the backplate layer 30 in structure. As a result, the acoustic holes 102 also expose the dielectric layer 26.

Figure 2F:
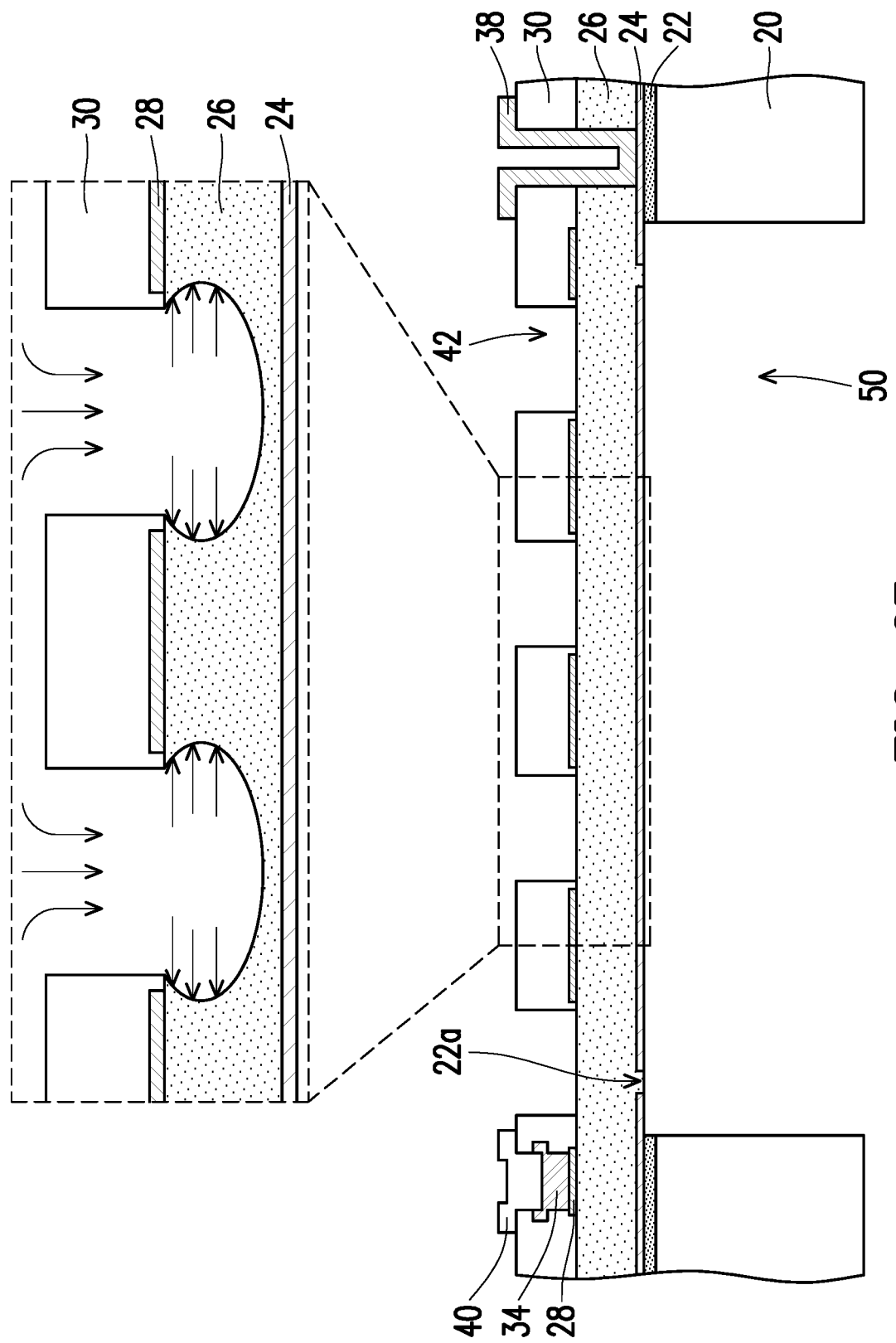

Referring to FIG. 2F, the substrate 20 is patterned to have the opening 50, which is corresponding to the region to release the conductive layer 24. Then, an etching process such as an isotropic etching process is performed to etch the dielectric layer 22 and the dielectric layer 26 at both sides of the conductive layer 24. As noted, in an embodiment, the dielectric layer 26, such as nitride, is different from the material of the backplate layer 30, such as nitride.

The etching process may etch the dielectric layer 26 through the acoustic holes 42. The etching mechanism in detail of a region is also shown. The dielectric layer 26 between the conductive layer 24 and the backplate layer 30 is relatively thick and needs to be etched gradually. The dielectric layer 26 produces mechanical intensity. However, the acoustic hole 42 is arranged to be substantially uniform intensity around the acoustic hole 42. The etching process is evenly applied to the dielectric layer 26 from the acoustic hole 42. As a result, the etchant used in the etching process may have better uniformity to etch the dielectric material. The etching process may be stable and fast, so to release the conductive layer 24.

Figure 2G:
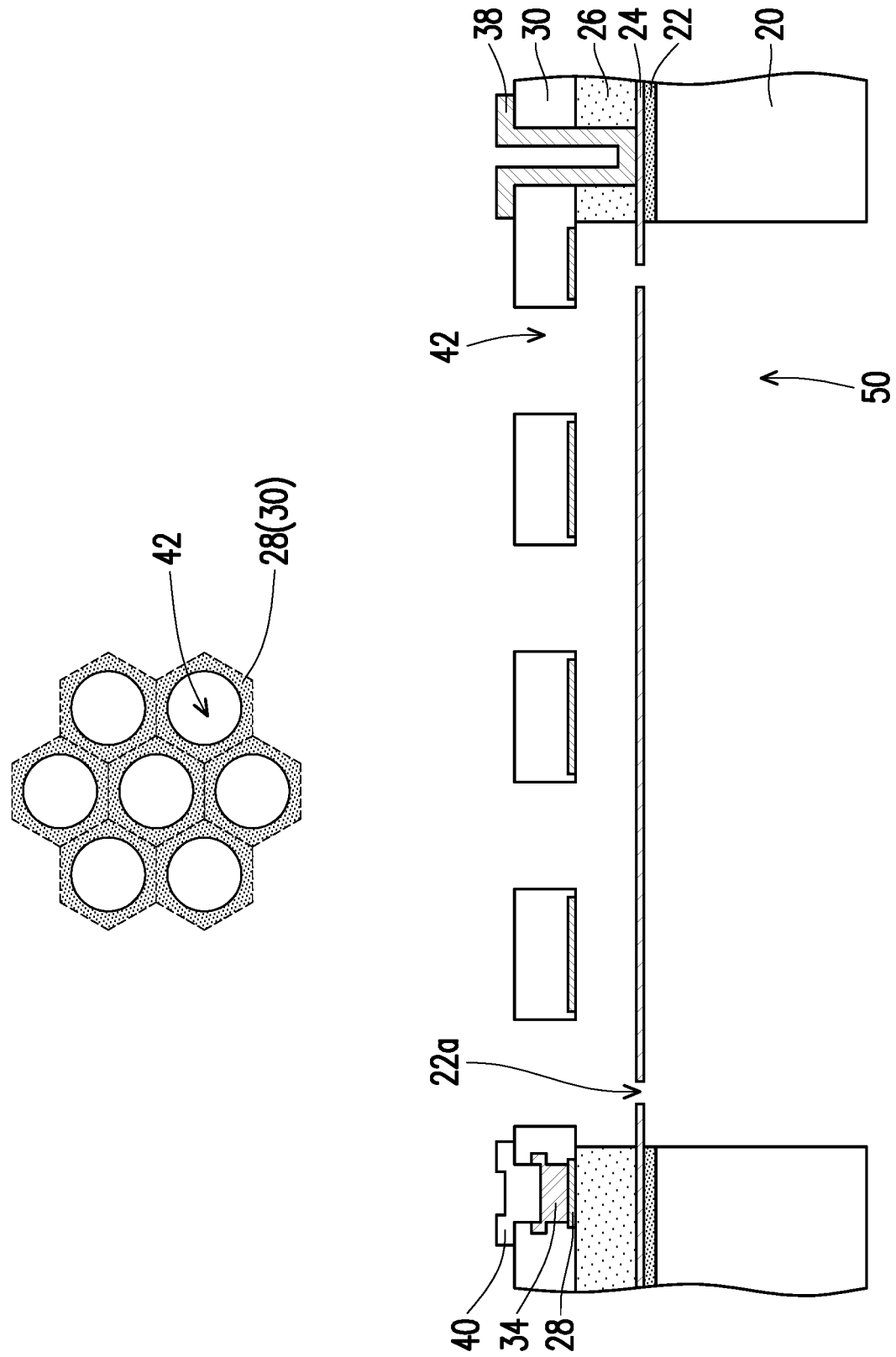

Referring to FIG. 2G, after the etching process is performed to etch the dielectric layer 22 and dielectric layer 26. The central region of the conductive layer 24 is exposed or released in other words. The peripheral region of the conductive layer 24 is embedded in the dielectric layer 22, 26, which supports the conductive layer 24. The conductive layer 24 serves as a diaphragm of the MEMS microphone.

A plane view over a partial of the backplate layer 30 is also shown at top in FIG. 2G. The acoustic hole 42 is round shape, so that the peripheral etching intensity is uniform. According to the distribution of the acoustic holes 42 with the arrangement of the acoustic holes 102, the interfacing acoustic holes 104 and the outer-ring acoustic holes 106, the dielectric layer under the backplate layer 30 may be more uniformly etched through the acoustic holes 42 at the central region and the peripheral region.

In addition, the pressure balance holes 22a in the conductive layer 24, that is diaphragm, are also exposed. The function of the pressure balance holes 22a is to reduce the unbalance air pressure at two sides of the conductive layer 24 when the acoustic holes 42 suffer the sudden and large air pressure from ambient, such as blowing wind. In normal operation, the pressure balance holes 22a may reduce the cut-off frequency in sensing the acoustic signal, so that the diaphragm or the conductive layer 24 may sense more acoustic signal at the low frequency region.

Also noted in the embodiment, the pressure balance holes 22a are evenly distributed at the peripheral region of the conductive layer 24. However, the pressure balance holes 22a may set at the central region of the conductive layer 24 with respect to the opening 50, as shown in FIG. 3. The invention is not limited to the embodiment.

As described above, the invention provides a MEMS microphone. The MEMS microphone includes a substrate, having a first opening. A dielectric layer is disposed on the substrate, wherein the dielectric layer has a second opening aligned to the first opening. A diaphragm is disposed within the second opening of the dielectric layer, wherein a peripheral region of the diaphragm is embedded into the dielectric layer at sidewall of the second opening. A backplate layer is disposed on the dielectric layer and covering over the second opening. The backplate layer includes a plurality of acoustic holes 102 arranged into a regular array pattern. The regular array pattern comprises a pattern unit, such as a hexagon unit, the pattern unit comprises one of the acoustic holes as a center hole, and peripheral holes of the acoustic holes surrounding the center hole with a same pitch to the center hole.

The invention also provides another MEMS microphone. In an embodiment, the MEMS microphone includes a substrate, having a first opening. A dielectric layer is disposed on the substrate, wherein the dielectric layer has a second opening aligned to the first opening. A diaphragm is disposed within the second opening of the dielectric layer, wherein a peripheral region of the diaphragm is embedded into the dielectric layer at sidewall of the second opening. A backplate layer is disposed on the dielectric layer and covering over the second opening. The backplate layer includes a plurality of acoustic holes arranged into a regular array pattern. The regular array pattern includes a hexagon unit, each hexagon unit has six of the acoustic holes at corners and one of the acoustic holes at a center.

In an embodiment, as to the structure of MEMS microphone, the acoustic holes are rounds holes in same size.

In an embodiment, as to the structure of MEMS microphone, the acoustic holes are hexagon holes in same size.

In an embodiment, as to the structure of MEMS microphone, the backplate layer comprises a dielectric backplate layer and an electrode layer disposed on one side of the dielectric backplate layer.

In an embodiment, as to the structure of MEMS microphone, the diaphragm includes a plurality of pressure balance holes.

In an embodiment, as to the structure of MEMS microphone, the pressure balance holes are evenly distributed at peripheral region of the diaphragm within the second opening of the dielectric layer.

In an embodiment, as to the structure of MEMS microphone, the pressure balance holes are distributed at a central region of the diaphragm.

In an embodiment, as to the structure of MEMS microphone, the diaphragm is a circular conductive layer.

In an embodiment, as to the structure of MEMS microphone, it further includes a first plug structure, penetrating the backplate layer and the dielectric layer to connect to the diaphragm at the peripheral region. A second plug structure is disposed in the backplate layer to connect to an electrode layer of the backplate layer.

In an embodiment, the invention also provides a method for fabricating MEMS microphone. The method includes providing a substrate; forming a dielectric layer on the substrate, wherein the dielectric layer is embedded with a diaphragm; forming a backplate layer on the dielectric layer, wherein the backplate layer includes a plurality of acoustic holes arranged into a regular array pattern. The regular array pattern includes a hexagon unit. Each hexagon unit has six of the acoustic holes at corners and one of the acoustic holes at a center. The substrate is patterned to have a first opening. An etching process is performed to etch a portion of the dielectric layer to form a second opening for releasing a sensing region of the diaphragm, wherein the etching process includes etching the dielectric layer through the acoustic holes at one side of the diaphragm.

In an embodiment, as to the method for fabricating MEMS microphone, the acoustic holes are rounds holes in same size.

In an embodiment, as to the method for fabricating MEMS microphone, the acoustic holes are hexagon holes in same size.

In an embodiment, as to the method for fabricating MEMS microphone, the step for forming the backplate layer comprises forming an electrode layer on the dielectric layer; and forming a dielectric backplate layer on the dielectric layer and the electrode layer; patterning the dielectric backplate layer to form the acoustic holes.

In an embodiment, as to the method for fabricating MEMS microphone, the diaphragm includes a plurality of pressure balance holes.

In an embodiment, as to the method for fabricating MEMS microphone, the pressure balance holes are evenly distributed at peripheral region of the diaphragm within the second opening of the dielectric layer.

In an embodiment, as to the method for fabricating MEMS microphone, the pressure balance holes are distributed at a central region of the diaphragm.

In an embodiment, as to the method for fabricating MEMS microphone, the diaphragm is a circular conductive layer.

In an embodiment, as to the method for fabricating MEMS microphone, it further comprises forming a first plug structure, penetrating the backplate layer and the dielectric layer to connect to the diaphragm at the peripheral region; and forming a second plug structure, disposed in the backplate layer to connect to an electrode layer of the backplate layer.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structure of micro-electro-mechanical-system (MEMS) microphone, comprising:
    a substrate, having a first opening;
    a dielectric layer, disposed on the substrate, wherein the dielectric layer has a second opening aligned to the first opening;
    a diaphragm, disposed within the second opening of the dielectric layer, wherein a peripheral region of the diaphragm is embedded into the dielectric layer at sidewall of the second opening; and
    a backplate layer, disposed on the dielectric layer and covering over the second opening, wherein the backplate layer includes a plurality of acoustic holes arranged into a regular array pattern, wherein the regular array pattern comprises a pattern unit, the pattern unit comprises one of the acoustic holes as a center hole, and peripheral holes of the acoustic holes surrounding the center hole with a same pitch to the center hole,
    wherein the backplate layer is configured to have a central region and a peripheral region, the acoustic holes are distributed within the central region,
    wherein the backplate layer within the peripheral region further includes outer-ring acoustic holes and interfacing acoustic holes, wherein the outer-ring acoustic holes with a first size being uniform are distributed as a ring at a periphery of the backplate layer and the interfacing acoustic holes with a second size being non-uniform are distributed between the ring and the central region, wherein a second size is less than the first size.

2. A structure of micro-electro-mechanical-system (MEMS) microphone, comprising:
    a substrate, having a first opening;
    a dielectric layer, disposed on the substrate, wherein the dielectric layer has a second opening aligned to the first opening;
    a diaphragm, disposed within the second opening of the dielectric layer, wherein a peripheral region of the diaphragm is embedded into the dielectric layer at sidewall of the second opening; and
    a backplate layer, disposed on the dielectric layer and covering over the second opening, wherein the backplate layer includes a plurality of acoustic holes arranged into a regular array pattern, the regular array pattern includes a hexagon unit, each hexagon unit has six of the acoustic holes at corners and one of the acoustic holes at a center,
    wherein the backplate layer is configured to have a central region and a peripheral region, the acoustic holes are distributed within the central region,
    wherein the backplate layer within the peripheral region further includes outer-ring acoustic holes and interfacing acoustic holes, wherein the outer-ring acoustic holes with a first size being uniform are distributed as a ring at a periphery of the backplate layer and the interfacing acoustic holes with a second size being non-uniform are distributed between the ring and the central region, wherein a second size is less than the first size.

3. The structure of MEMS microphone as recited in claim 2, wherein the acoustic holes are rounds holes in same size.

4. The structure of MEMS microphone as recited in claim 2, wherein the acoustic holes are hexagon holes in same size.

5. The structure of MEMS microphone as recited in claim 2, wherein the backplate layer comprises:
    a dielectric backplate layer; and
    an electrode layer, disposed on one side of the dielectric backplate layer.

6. The structure of MEMS microphone as recited in claim 2, wherein the diaphragm includes a plurality of pressure balance holes.

7. The structure of MEMS microphone as recited in claim 6, wherein the pressure balance holes are evenly distributed at peripheral region of the diaphragm within the second opening of the dielectric layer.

8. The structure of MEMS microphone as recited in claim 6, wherein the pressure balance holes are distributed at a central region of the diaphragm.

9. The structure of MEMS microphone as recited in claim 2, wherein the diaphragm is a circular conductive layer.

10. The structure of MEMS microphone as recited in claim 2, further comprising:

a first plug structure, penetrating the backplate layer and the dielectric layer to connect to the diaphragm at the peripheral region;

a second plug structure, disposed in the backplate layer to connect to an electrode layer of the backplate layer.

11. A method for fabricating micro-electro-mechanical-system (MEMS) microphone, comprising:

providing a substrate;

forming a dielectric layer on the substrate, wherein the dielectric layer is embedded with a diaphragm;

forming a backplate layer on the dielectric layer, wherein the backplate layer includes a plurality of acoustic holes arranged into a regular array pattern, the regular array pattern includes a hexagon unit, each hexagon unit has six of the acoustic holes at corners and one of the acoustic holes at a center;

patterning the substrate to have a first opening; and performing an etching process to etch a portion of the dielectric layer to form a second opening for releasing a sensing region of the diaphragm, wherein the etching process includes etching the dielectric layer through the acoustic holes at one side of the diaphragm, wherein the backplate layer as formed is configured to have a central region and a peripheral region, the acoustic holes are distributed within the central region, wherein the backplate layer within the peripheral region further includes outer-ring acoustic holes and interfacing acoustic holes, wherein the outer-ring acoustic holes with a first size being uniform are distributed as a ring at a periphery of the backplate layer and the interfacing acoustic holes with a second size being non-uniform are distributed between the ring and the central region, wherein a second size is less than the first size.

12. The method for fabricating MEMS microphone as recited in claim 11, wherein the acoustic holes are rounds holes in same size.

13. The method for fabricating MEMS microphone as recited in claim 11, wherein the acoustic holes are hexagon holes in same size.

14. The method for fabricating MEMS microphone as recited in claim 11, wherein the step for forming the backplate layer comprises:

forming an electrode layer on the dielectric layer;

forming a dielectric backplate layer on the dielectric layer and the electrode layer; and patterning the dielectric backplate layer to form the acoustic holes.

15. The method for fabricating MEMS microphone as recited in claim 11, wherein the diaphragm includes a plurality of pressure balance holes.

16. The method for fabricating MEMS microphone as recited in claim 11, wherein the pressure balance holes are evenly distributed at peripheral region of the diaphragm within the second opening of the dielectric layer.

17. The method for fabricating MEMS microphone as recited in claim 11, wherein the pressure balance holes are distributed at a central region of the diaphragm.

18. The method for fabricating MEMS microphone as recited in claim 11, wherein the diaphragm is a circular conductive layer.

19. The method for fabricating MEMS microphone as recited in claim 11, further comprising:

forming a first plug structure, penetrating the backplate layer and the dielectric layer to connect to the diaphragm at the peripheral region; and forming a second plug structure, disposed in the backplate layer to connect to an electrode layer of the backplate layer.

* * * * *